United States Patent [19]
Glausecker et al.

[11] 3,872,400
[45] Mar. 18, 1975

[54] SEMI CONDUCTOR LASER

[75] Inventors: Karl Glausecker, Oberkirchberg; Uwe Gnutzmann, Ulm/Donau, both of Germany

[73] Assignee: Licentia Patent-Verwaltungs-G.m.b.H., Frankfurt/Main, Germany

[22] Filed: July 28, 1972

[21] Appl. No.: 276,162

[30] Foreign Application Priority Data
Aug. 6, 1971 Germany............................ 2139436

[52] U.S. Cl...................... 331/94.5 H, 357/1, 357/4, 357/16, 357/18
[51] Int. Cl.............................. H01s 3/18, H01l 3/12
[58] Field of Search..... 317/235 N, 235 AD, 234 V, 317/234 T; 357/1, 3, 4, 16, 18; 331/94.5 H

[56] References Cited
UNITED STATES PATENTS

| | | | |
|---|---|---|---|
| 3,305,685 | 2/1967 | Wang | 317/235 |
| 3,309,553 | 3/1967 | Kroemer | 317/235 |
| 3,483,487 | 12/1969 | Nanney | 317/235 |
| 3,626,257 | 12/1971 | Esaki et al. | 317/235 |
| 3,721,583 | 3/1973 | Blakeslee | 317/234 T |
| 3,737,737 | 6/1973 | Heywang et al. | 317/235 N |

*Primary Examiner*—Martin H. Edlow
*Assistant Examiner*—William D. Larkins
*Attorney, Agent, or Firm*—Spencer & Kaye

[57] ABSTRACT

A semiconductor laser comprising a semiconductor body of a material with indirect optical transitions between its conduction and Valence bands which is constructed to displace an absolute minimum of its conduction band to the absolute maximum of its valence band to achieve direct optical transitions.

18 Claims, 6 Drawing Figures

SEMI CONDUCTOR LASER

BACKGROUND OF THE INVENTION

This invention relates to semiconductor lasers.

In present-day semiconductor technology, silicon is substantially used as the semiconductor material, since silicon technology is well controlled. In a few semiconductor devices such as Gunn diodes or semiconductor lasers, however, one is compelled to use for example gallium arsenide as the semiconductor material, since the III-V-semiconductors have special properties which, to date, have not yet been realized in the case of the elementary semiconductors germanium and silicon. Since the elementary semiconductor technology is substantially better controlled than the compound semiconductor technology, it would be desirable also to be able to manufacture semiconductor lasers on the basis of elementary semiconductors.

SUMMARY OF THE INVENTION

It is an object of the invention to provide a semiconductor laser the semiconductor body of which consists of semiconductor material with an indirect optical transition and thus can comprise, for example, of germanium or silicon.

According to the invention, there is provided a semiconductor laser comprising a semiconductor body formed of a material having an indirect optical transition between its conduction band and its valence band having at least a portion which is constructed to displace an absolute minimum of its conduction band to the absolute maximum of its valence band to achieve direct optical transitions.

BRIEF DESCRIPTION OF THE DRAWINGS

The invention will now be described in greater detail, by way of example, with reference to the drawings, in which.

DESCRIPTION OF THE PREFERRED EMBODIMENTS

Basically, the invention proposes that in a semiconductor laser with a semiconductor body, the semiconductor material of which has an indirect optical transition, the semiconductor body is constructed in such a manner that an absolute minimum of the conduction band of its semiconductor material is displaced to the absolute maximum of the valence band to achieve direct optical transitions. The absolute minimum of the conduction band in this case moves in an element semiconductor, constructed in accordance with the invention, substantially nearer to the position of the valence band maximum than in a known element semiconductor.

At least one absolute minimum of the conduction band is displaced from the edge region of the Brillouin zone of the crystal lattice to its centre. By crystal lattice, the lattice of the starting material is to be understood, which is still not yet treated according to the invention.

Figure 1A:
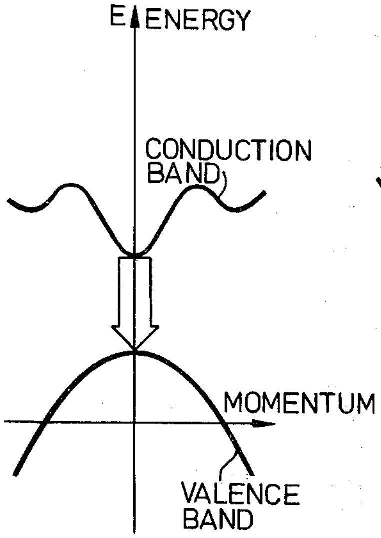
FIG. 1*a* is a graphical representation of the valence and conduction bands of a compound semiconductor body.

Direct optical transitions have been until now only in the case of semiconductors such as III-V compounds, the absolute conduction band minimum of which lies directly above the absolute valence band maximum in the $k$ space (momentum space) corresponding to FIG. 1*a*. The transition of an electron with the emission of a photon (lightwave) is, in this case, possible without momentum exchange with a phonon. The probability for this process is relatively large. Accordingly, compound semiconductors such as e.g., GaAs are well suited for the manufacture of a laser.

Figure 1B:
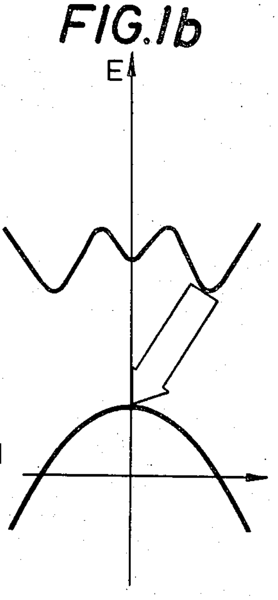
FIG. 1*b* is a graphical representation of the valence and conduction bands of an elementary semiconductor body.

In comparison, element semiconductors have indirect optical transitions, since in them the absolute minimum of the conduction band and the absolute maximum of the valence band according to FIG. 1*b* in the $k$-space lie relatively far apart. Since in the indirect transition three particles take place (three particle collosion of electron, photon and phonon), the probability of this process is relatively small and additionally depends on the phonon density and thus very heavily on the temperature.

Figure 1C:
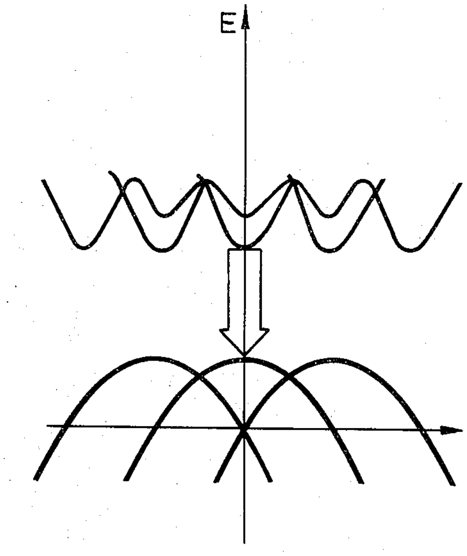
FIG. 1*c* is a graphical representation of the valence and conduction bands of an elementary semiconductor body in accordance with the invention.

The use of semiconductor materials with an indirect optical transition for semiconductor lasers is made possible in accordance with the invention in that the individual side minima of the conduction band are displaced in the $k$-space to the position of the valence band maximum ($\Gamma$-point) according to FIG. 1*c*. In this way direct optical transitions are possible in the "indirect semiconductor material."

The displacement of an absolute minimum of the conduction band to the absolute maximum of the valence band according to the invention is, for example, achieved in that the semiconductor body receives a repeated superstructure. By repeated superstructure is understood a periodic change of the structure of the semiconductor body.

According to one form of embodiment of the invention the structure of the semiconductor body is repeatedly altered in the crystallographic direction of an absolute minimum of the conduction band of a semiconductor material. The length of the repeat interval is chosen to be smaller than the mean free path length of the conduction electrons in the semiconductor body. The amplitude of the potential of the repeated structure is chosen to be smaller than the band spacing of the semiconductor material. The potential of the structure is the energetic influence on the electrons.

Figure 2:
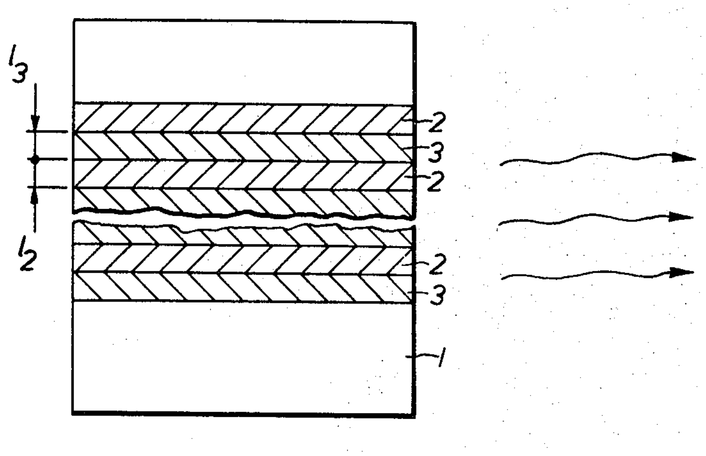
FIG. 2 shows an example of a different doping of a semiconductor body in accordance with the invention.

A repeated change of the structure of the semiconductor body is, for example, obtained by different doping or in that the semiconductor body is differently provided with crystal structure defects such as dislocations or point defects. FIG. 2 shows, as an example an alternating doping, in which the semiconductor body 1 contains two different doped layers 2 and 3 which always repeatedly return. By a repeat interval is to be understood the width of two sequential layers 2 and 3, i.e., a repeat interval is equal to $l_2 + l_3$. The structure of the semiconductor body can, for example, be periodically changed also by alloying. In the exemplary embodiment of FIG. 2 there is, in this case, e.g., one layer which is alloyed with a non-semiconducting material, whereas the adjoining layer is pure semiconductor material and not alloyed. However, both layers 2 and 3 can also be alloyed, but in this case differently.

A semiconductor laser with repeated changing of the structure of the semiconductor body can, for example, be so constructed that the total semiconductor body has the same type of conductivity and thus no pn-junction is present. In this case there is obtained a semiconductor laser without a pn-junction such as is shown, for example, in FIG. 3. Such a semiconductor laser without a pn-junction is, for example, pumped by light or an electron beam.

Figure 4:
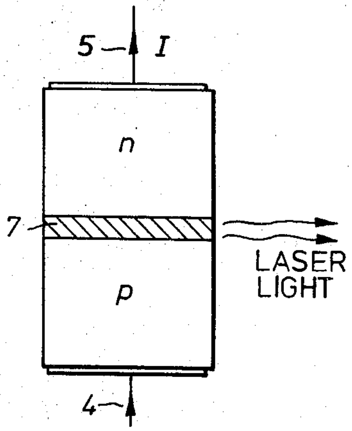
FIG. 4 shows a semiconductor laser in accordance with the invention with a pn-junction.

FIG. 4 shows, in comparison thereto, a semiconductor laser with a pn-junction, in which, in comparison to the laser without a pn-junction, the electrodes 4 and 5 are necessary on the semiconductor body 1, since an injection current must be used to pump a semiconductor laser with a pn-junction.

Induced emission of light due to transitions of the electrons from the conduction band of the semiconductor into its valence band occurs in both semiconductor laser types only if the occupation density of electrons in the conduction band is so high that the inversion requirement $$F_L - F_V \geq h\nu$$

is fulfilled ($F_L$, $F_V$ = quasi-Fermi level in the conduction or valence band, $h\nu$ = energy of a light quantum). This is achieved in the case of the two above-mentioned types of laser in essentially different manners.

Figure 3:
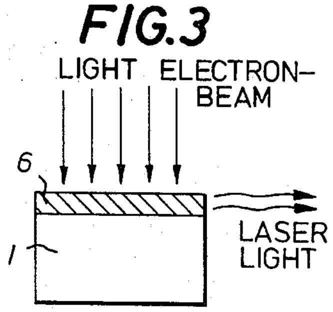
FIG. 3 shows a semiconductor laser in accordance with the invention without a pn-junction.

In the case of a laser without a pn-junction (FIG. 3), it is achieved by irradiation of light or electrons on the surface of the semiconductor body. The few μm thickness zone of the laser light in this case lies directly under the irradiated surface (FIG. 3). In the case of a semiconductor laser with a pn-junction, there is obtained the inversion, on the other hand, according to FIG. 4 in the region of the pn-junction, of a diode through an injection current of charge carriers.

In the case of a semiconductor laser with a pn-junction the structure of the semiconductor body is preferably repeatedly changed perpendicularly to the course of the pn-junction. In accordance with one form of embodiment of the invention the periodic structural change extends only to the region of the pn-junction. The total length of the repeated structure is chosen, in a semiconductor laser with a pn-junction, greater or the same as the free path length of the electrons, but smaller or equal to the extension of the pn-junction.

A repeated structure is, in general, necessary only in the laser active region of the semiconductor body. By a laser active region is understood, in a semiconductor laser, without pn-junction, the irradiated surface layer (reference number 6 in FIG. 3) and in a semiconductor laser with pn-junction the region of the pn-junction (reference number 7 in FIG. 4).

What is claimed is:

1. A semiconductor laser comprising a semiconductor body formed of a material having an indirect optical transition between its conduction band and its valence band and having at least a portion which is constructed to displace an absolute secondary minimum of its conduction band to the absolute maximum of its valence band to achieve direct optical transitions, and pumping means for applying energy to said semiconductor body to induce the emission of light from said semiconductor body.

2. A semiconductor laser as defined in claim 1 wherein said portion of a semiconductor body is constructed to displace at least one absolute minimum of its conduction band from the edge region of the Brillouin zone of the original translation lattice to the centre of said Brillouin zone.

3. A semiconductor laser as defined in claim 1 wherein said portion of said semiconductor body has a structure which is repeatedly changed.

4. A semiconductor laser as defined in claim 3 wherein said structure is repeatedly changed in the crystallographic direction of an absolute minimum of its conduction band.

5. A semiconductor laser as defined in claim 3, wherein said repeatedly changed structure has a period which is smaller than the mean free path length of the conduction electrons in said semiconductor body.

6. A semiconductor laser as defined in claim 3, wherein the amplitude of the potential of said repeatedly changed structure is smaller than the band spacing of said semiconductor material.

7. A semiconductor laser as defined in claim 3, wherein said repeatedly changed structure comprises different doping of said semiconductor body.

8. A semiconductor laser as defined in claim 3, wherein said repeatedly changed structure comprises crystal defects in said semiconductor body.

9. A semiconductor laser as defined in claim 8, wherein said crystal defects comprise dislocations.

10. A semiconductor laser as defined in claim 8, wherein said crystal defects comprise point defects.

11. A semiconductor laser as defined in claim 3, wherein said repeatedly changed structure comprises a structure repeatedly changed by alloying.

12. A semiconductor laser as defined in claim 3, wherein said semiconductor body is entirely of the same type of conductivity.

13. A semiconductor laser as defined in claim 12, wherein: said pumping means includes means for irradiating a surface of said semiconductor body; and said repeatedly changed structure is provided only immediately under said irradiated surface.

14. A semiconductor laser as defined in claim 3, wherein said semiconductor body includes a pn-junction.

15. A semiconductor laser as defined in claim 14, wherein said repeatedly changed structure comprises a structure periodically changed perpendicularly to the course of said pn-junction.

16. A semiconductor laser as defined in claim 14 wherein said repeatedly changed structure is provided only in the region of the pn-junction.

17. A semiconductor laser as defined in claim 14, wherein said repeatedly changed structure has a total length greater or equal to the free path length of the electrons, but smaller or equal to the extension of the pn-junction.

18. A semiconductor laser as defined in claim 14, wherein said semiconductor body has outside the region of said pn-junction, only repeated structures, if any, which are larger than the free path lengths of the conductor electrons.

* * * * *

UNITED STATES PATENT OFFICE
CERTIFICATE OF CORRECTION

PATENT NO. : 3,872,400
DATED : March 18th, 1975
INVENTOR(S) : Karl Clausecker et al It is certified that error appears in the above-identified patent and that said Letters Patent are hereby corrected as shown below:

In the heading of the patent, change the inventor's name from "Glausecker" to --Clausecker-- (two occurrences).

Signed and Sealed this

*nineteenth* Day of *August 1975*

[SEAL]

*Attest:*

RUTH C. MASON
*Attesting Officer*

C. MARSHALL DANN
*Commissioner of Patents and Trademarks*